(12) United States Patent
Heinrich et al.

(10) Patent No.: US 9,407,204 B2
(45) Date of Patent: Aug. 2, 2016

(54) METHOD FOR PROCESSING A FREQUENCY-MODULATED ANALOG SIGNAL AND CORRESPONDING DEVICE

(71) Applicants: STMicroelectronics SA, Montrouge (FR); STMicroelectronics (Grenoble 2) SAS, Grenoble (FR)

(72) Inventors: Vincent Heinrich, Izeaux (FR); Bruno Paille, Engins (FR)

(73) Assignees: STMicroelectronics SA, Montrouge (FR); STMicroelectronics (Grenoble 2) SAS, Grenoble (FR)

( * ) Notice: Subject to any disclaimer, the term of this patent is extended or adjusted under 35 U.S.C. 154(b) by 274 days.

(21) Appl. No.: 14/219,716

(22) Filed: Mar. 19, 2014

(65) Prior Publication Data

US 2014/0287705 A1    Sep. 25, 2014

(30) Foreign Application Priority Data

Mar. 25, 2013  (FR) ...................... 13 52653

(51) Int. Cl.
*H04K 1/10* (2006.01)
*H04L 27/28* (2006.01)
*H03D 3/06* (2006.01)
*H04L 27/144* (2006.01)
*H04L 27/16* (2006.01)

(52) U.S. Cl.
CPC ............... *H03D 3/06* (2013.01); *H04L 27/144* (2013.01); *H04L 27/16* (2013.01)

(58) Field of Classification Search
CPC ........ H03D 3/06; H04L 27/144; H04L 27/16; H04L 27/2621; H04L 27/263; H04L 27/2614; H04L 27/2636; H04L 27/12

USPC .......... 375/239, 260, 275, 272, 303; 332/117
See application file for complete search history.

(56) References Cited

U.S. PATENT DOCUMENTS

| | | | | |
|---|---|---|---|---|
| 2005/0169401 A1* | 8/2005 | Abraham | ............... | H04B 3/54 375/295 |
| 2007/0165730 A1* | 7/2007 | Whinnett | ............ | H04L 27/2614 375/260 |
| 2010/0097923 A1* | 4/2010 | Zhao | .................. | H04J 11/0026 370/210 |
| 2010/0098182 A1* | 4/2010 | Forck | ................. | H04L 27/2636 375/261 |
| 2010/0142605 A1* | 6/2010 | Chamberlain | ....... | H04B 1/0475 375/230 |
| 2011/0096854 A1* | 4/2011 | Fanson | .................... | H04L 27/12 375/260 |
| 2011/0122938 A1* | 5/2011 | Kameya | ................ | H04L 27/263 375/228 |
| 2015/0271001 A1* | 9/2015 | Lanoiselee | .......... | H04L 27/2621 375/260 |

* cited by examiner

*Primary Examiner* — Phuong Phu
(74) *Attorney, Agent, or Firm* — Slater Matsil, L.L.P.

(57) ABSTRACT

A method and corresponding device for processing a frequency-modulated analog signal are disclosed. The signal includes a number of symbols belonging to a set of M symbols respectively associated with at least one frequency of a set of M frequencies. The method includes a phase of reading each symbol of the signal that includes a sampling of a signal portion corresponding to the duration of a symbol and delivering N samples (M being less than N). M individual discrete Fourier transform processing operations are performed on the N samples. Each individual processing operation is associated with each of the frequencies. The M individual processing operations deliver M processing results. The value of the symbol can be determined from the M processing results.

27 Claims, 4 Drawing Sheets

METHOD FOR PROCESSING A FREQUENCY-MODULATED ANALOG SIGNAL AND CORRESPONDING DEVICE

This application claims the benefit of French Application No. 1352653, filed on Mar. 25, 2013, which application is hereby incorporated herein by reference.

TECHNICAL FIELD

The invention relates to the processing of analog signals, in particular those that are frequency modulated. Particular embodiments apply to the processing of signals with a frequency situated in the band situated in the vicinity of 2.4 GHz, and to the signals transmitted in a noisy environment.

BACKGROUND

A frequency modulation is generally used to send signals comprising a succession of symbols, each symbol being associated with a frequency, in order to then read them by detecting the frequency. It has been proposed to use phase-locked loops to detect the frequencies used. However, such a solution can work only for signals with a signal-to-noise ratio of good quality.

It is also possible to apply a fast Fourier transform processing operation, well known to a person skilled in the art by the acronym "FFT", to retrieve the symbols contained in the signals.

Applying a fast Fourier transform processing operation has the drawback of requiring a large number of samples that correspond to as many frequencies to be processed to be obtained previously in order to read the symbols. Since the complexity of the calculation increases by $O(n.\log(n))$ (big O notation, or Landau notation), n being the number of samples, the need to use a large number of samples makes the processing of a message by fast Fourier transform particularly complex.

Although such an FFT-based solution is suitable for processing signals that have been sent in a very noisy environment, this solution has the drawback of being too complex. "Very noisy" should be understood to mean an environment in which the signal-to-noise ratio in reception is of the order of −10 dB to −20 dB.

SUMMARY

According to one embodiment and implementation, it is proposed to process a frequency-modulated analog signal in a way that is simpler, and also compatible with a noisy environment.

According to one aspect, a method is proposed for processing a frequency-modulated analog signal, the signal comprising a number of symbols belonging to a set of M symbols, each symbol being associated with at least one frequency of a set of M frequencies.

According to a general feature, the method comprises a phase of reading each symbol of the signal including a sampling of a signal portion corresponding to the duration of a symbol and delivering N samples. M is less than N. M individual discrete Fourier transform (DFT) processing operations are performed on the N samples. Each individual processing operation is associated with each of the frequencies. The M individual processing operations delivers M processing results. The value of the symbol can be determined from the M processing results.

The result may be, for example, the modulus of the complex obtained by the individual discrete Fourier transform processing operation associated with a frequency.

In practice the maximum result (modulus) supplies the frequency sought and consequently the value of the symbol.

In order to associate the individual processing operations with one of the frequencies, it will be possible to use an index linked to the sampling frequency, to the frequency, and to M. With a signal-to-noise ratio ranging from −10 dB to −20 dB, it is found that the maximum result is associated with the frequency of the symbol read.

In order to improve this reading, it is possible to read signals that have a long symbol period or duration, for example a millisecond.

An individual processing operation should be understood to mean a processing operation associated with a single frequency.

Unlike a processing operation of FFT type in which N processing operations are implemented, only a reduced number M of individual discrete Fourier transform processing operations are implemented here. As an example, to process 12 000 samples in which one symbol is to be found out of 16 symbols, only 16 individual processing operations are implemented, whereas a complete FFT requires 12 000 individual processing operations.

Contrary to the prior art, and in particular contrary to the processing operations using phase-locked loops, it is possible to read signals with poor signal-to-noise ratios.

The method can comprise an initial phase of processing a header, or preamble, comprising a succession of known symbols. The initial phase comprises a determination of a frequency difference of the M frequencies relative to their nominal value and a determination of a time offset of one of the known symbols of the header relative to the sampling start instant associated with this symbol.

Although it is possible to not implement any initial header processing phase, better results are obtained after having implemented this step.

The determination of the frequency difference may comprise selects a group of P frequencies situated in the vicinity of the frequency associated with a first known symbol. A signal portion corresponding to the duration of a number of symbols is sampled. P individual discrete Fourier transform processing operations respectively associated with the P frequencies of the groups are performed. The P individual processing operations deliver P results. The frequency difference is determined from the maximum of the P results.

The header may therefore comprise a succession of a number of identical symbols, here the first symbol. If the symbol is associated with a single frequency, for a predefined period, the signal therefore corresponds to a sine whose frequency is fixed. The duration for which the first symbol is sent, is advantageously long enough to be able to collect sufficient samples (the number of samples corresponding to the number of frequencies P).

It will be noted that, here, it is considered that the frequency difference, which is measured with the first symbol, is valid for all the frequencies associated with the other symbols.

P individual processing operations can be performed in blocks of at most M simultaneous individual processing operations. It will be possible notably to use M individual processing modules that can operate in parallel. It is thus possible to speed up the determination of the frequency difference.

The determination of the frequency difference may also comprise a comparison of the maximum result with a first threshold, a determination of a second result corresponding to a second maximum, and a calculation of the ratio between the maximum result and the second result, and a comparison of the ratio with a second threshold.

The second maximum corresponds to the second highest value, after the maximum result.

Thus, it is possible to determine whether the maximum of the results effectively corresponds to a first symbol, and that this maximum does not correspond to noise. If such is the case, the method may comprise a reinitialization in which the initial step is re-implemented, until a maximum result is found which satisfies the threshold comparison criteria.

The determination of the time offset of one of the known symbols of the header may comprise a detection of a second known symbol different from the first known symbol. The determination of the time offset comprises at least R time-offset samplings of a signal portion having a duration corresponding to a symbol so as to obtain R sets of N samples. R individual discrete Fourier transform processing operations are performed on respectively the R sets of N samples. All these individual processing operations are associated with the frequency corresponding to the second symbol, so as to obtain R results. The time offset value is determined from the maximum of the R results.

Here, time-offset samplings are implemented. One of the samplings has an offset such that it begins almost at the same time as a symbol, here the second symbol. This way, by determining the maximum of the R results, the window is determined for which the result of the individual discrete Fourier transform processing operation for the frequency associated with the second symbol has the highest modulus, and it is therefore possible to deduce the time offset therefrom.

R may be equal to M. It will then be possible to implement time offsets that are all equal to the ratio between the duration of a symbol and M.

The determination of the time offset may comprise Q consecutive detections of the second known symbol, the Q detections delivering Q times R results, R additions of the Q homologous results and a determination of the time offset from the R results of the additions. The header may then comprise a succession of a string formed by the second known symbol and another different symbol. There are then Q alternations of two different symbols.

A better detection is thus obtained using a number of windows that have the same time offset in order to deduce therefrom the good time offset.

The M symbols may be respectively associated with at least two frequencies of the set of M frequencies. It is thus possible to deduce from the results of the individual discrete Fourier transform processing operations that two frequencies are present.

By detecting the presence of two frequencies, a more robust method is obtained which can work with a very poor signal-to-noise ratio.

According to another aspect, a device is proposed for processing a frequency-modulated analog signal. The signal comprises a number of symbols belonging to a set of M symbols. Each symbol is associated with at least one frequency of a set of M frequencies.

According to an embodiment, the device comprises a signal symbol reading unit which comprises a sampler suitable for delivering N samples from a signal portion corresponding to the duration of a symbol. M is less than N. M individual discrete Fourier transform processing modules have the N samples for input and output a processing result. Each individual processing module is associated with each of the frequencies. A module is configured to determine the value of the symbol having the M results for input.

Thus, it is possible to use M individual processing modules that can operate in parallel.

The device may comprise a unit for processing a header comprising a succession of known symbols. The unit includes a module configured to determine a frequency difference of the N frequencies relative to their nominal value. Another module is configured to determine a time offset of one of the known symbols of the header relative to the sampling start instant associated with this symbol.

The module configured to determine a frequency difference may comprise circuitry configured to select a group of P frequencies situated in the vicinity of the frequency associated with a first known symbol. circuitry can also be configured to sample a signal portion corresponding to the duration of a number of symbols and provide an output that communicates with the M individual processing modules to deliver P results. The individual processing modules are associated with frequencies of the group of P frequencies. Circuitry is configured to determine the frequency difference from the maximum of the P results.

The circuitry configured to determine the frequency difference may also comprise circuitry configured to compare the maximum result to a first threshold, circuitry configured to determine a second result corresponding to a second maximum, circuitry configured to calculate the ratio between the maximum result and the second result, and circuitry configured to compose the ratio with a second threshold.

The module configured to determine a time offset of one of the symbols may comprise circuitry configured to deliver R sets of N samples from R time-offset signal portions and whose output communicates with the M individual processing modules to deliver R results. Each individual processing module is associated with the frequency of a second known symbol, circuitry is configured to determine the time offset value from the maximum of the R results.

R may be equal to M.

The circuitry configured to deliver R sets of N samples may also be configured to deliver Q times R sets of samples to obtain Q times R circuitry. The module configured to determine the time position also comprises R means for adding the Q homologous results and means for determining the time offset from the R results of the additions.

The M symbols may be respectively associated with at least two frequencies of the set of M frequencies.

BRIEF DESCRIPTION OF THE DRAWINGS

Other advantages and features of the invention will become apparent on studying the detailed description of implementations and embodiments, taken as nonlimiting examples, and illustrated by the appended drawings in which.

DETAILED DESCRIPTION OF ILLUSTRATIVE EMBODIMENTS

Figure 1:
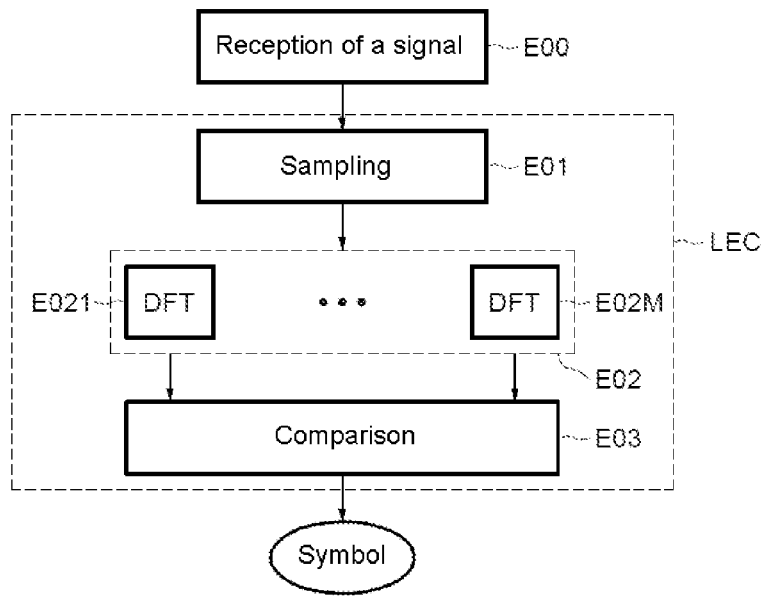
FIGS. 1 to 5 illustrate different steps of a method according to one implementation of the invention.

FIG. 1 schematically represents different steps of a method for processing a frequency-modulated analog signal, and, more specifically, a method that makes it possible to read a symbol of a signal. This signal may comprise a succession of symbols with which one or more frequencies have been associated, the symbols all having the same duration in the signal. The frequencies can be chosen in the vicinity of 2.4 GHz. As an example, for a set of M=16 symbols, each symbol can have associated with it a frequency chosen from the group ranging from 2.400 GHz to 2.4015 GHz. Also, the signal-to-noise ratio of the analog signal can be of the order of −10 dB or of the order of −20 dB notably as a function of the number N of samples used for the individual processing operations.

The frequency-modulated analog signal can then be received during a step E00. For example, the signal can be received by an antenna configured for the frequencies associated with the symbols.

In order to read a symbol (reading step LEC), a sampling step E01 is implemented, to obtain a number of samples equal to the number of possible symbols M. The sampling step E01 is implemented for a duration corresponding to the duration of a symbol, for example 1 millisecond.

The N samples obtained are used to implement a processing step E02 in which M individual discrete Fourier transform processing operations E021 to E02M are implemented. Each individual processing operation E02k is associated with one of the M frequencies, k being an index having M values between 1 and N. The index k can be associated with the sampling frequency fe and with the frequency fk corresponding to a symbol Sk according to the following formula:

$$k = N \frac{fk}{fe}$$

Furthermore, each individual discrete Fourier transform processing operation corresponds to the implementation of the following calculation:

$$DFT(k) = \left| \sum_{n=0}^{N-1} x(n) \cdot e^{-i2k\pi/N} \right|$$

where DFT(k) is the result of the individual processing operation associated with the frequency fk, and x(n) is one sample out of the N samples.

All the results DFT(k) can then be compared in a comparison step E03 in which the maximum of the results is determined. The maximum of the results indicates the frequency which was present in the sampled signal portion and it is therefore possible to deduce therefrom the symbol which is read. It is then possible to re-implement the steps E01 to E03 to determine the subsequent symbols.

Figure 2:
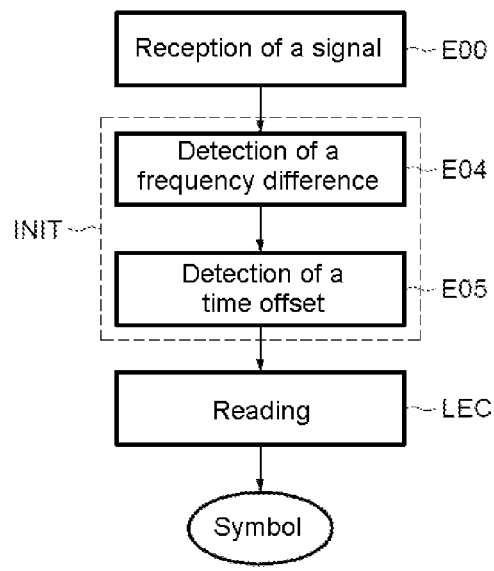

FIG. 2 schematically represents the steps of another implementation also comprising an initial phase INIT implemented after the step of reception of a signal E00 and before the step LEC described with reference to FIG. 1. The initial phase INIT comprises a first step E04 of detection of a frequency difference followed by a step E05 of detection of a time offset. The initial phase INIT is used to process a header of the signal, notably a header comprising known symbols.

Figure 3:
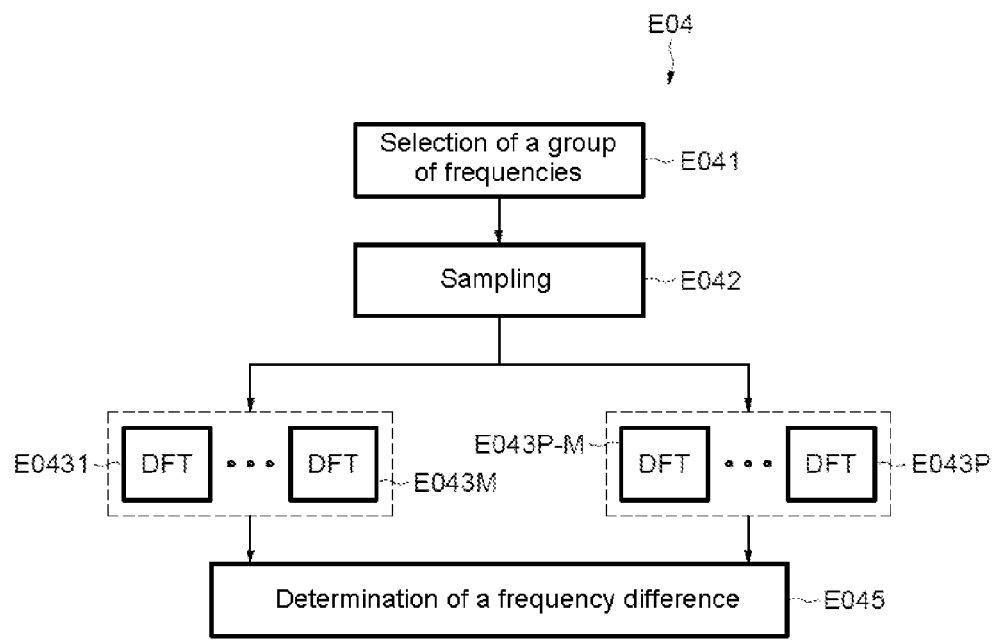

FIG. 3 represents, schematically and in more detail, the step E04 of detection of a frequency difference. In a step E041, a plurality of frequencies are selected, for example a number P of frequencies, situated in the vicinity of the nominal value of the frequency of a first known symbol, for example the symbol S0 of nominal frequency f0.

As an example, for a frequency f0=2.4 GHz, it is possible to see frequency differences appear of the order of plus or minus 200 kHz. These differences are due to the imperfections of the oscillators used in the circuits, both for the reception circuits and for the transmission circuits. In the step E041, a group of 200 frequencies can be selected, with a pitch of 2 kHz, in order to cover the 400 kHz band around f0.

It is then possible to sample the portion of the header corresponding to the duration of a number of symbols (step E042).

P individual discrete Fourier transform processing operations associated with each of the P frequencies can then be implemented (processing operations E0431 to E043P). It may be noted that these individual processing operations can be implemented in groups of M.

The P individual processing operations deliver P results, out of which it is possible to determine the maximum of the results, and the second maximum. The maximum can then be compared to a first threshold, and the ratio between the maximum and the second maximum can be compared to a second threshold. If the two values are above their respective thresholds, then the maximum indicates the real frequency associated with the symbol S0 and a frequency difference can be deduced therefrom (step E045).

It may be noted that it is possible to use individual discrete Fourier transform processing modules different from those used in the reading step LEC, in which case a different number of simultaneous individual processing operations will be implemented to process all the frequencies.

Also, if one of the two comparisons to a threshold has not been verified, then it can be considered that no first known symbol has been received. The step E042 can then be re-implemented and a new received signal portion sampled.

Figure 4:
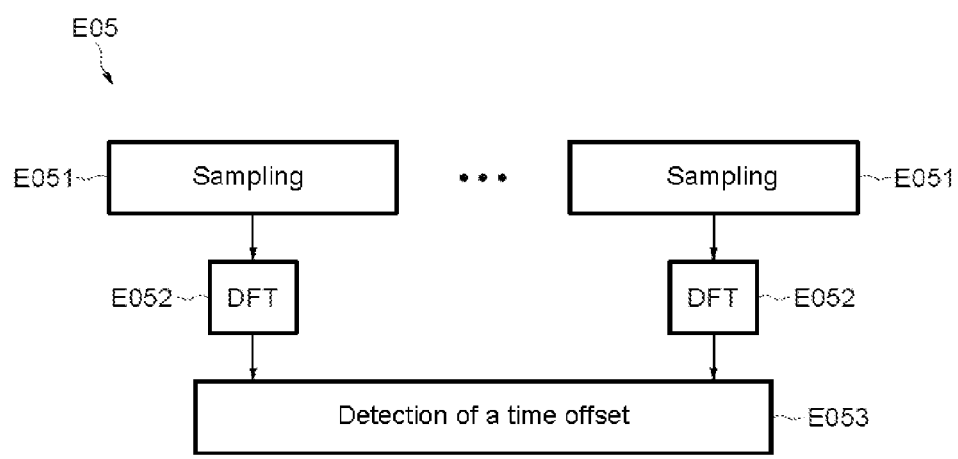

FIG. 4 represents in more detail the step E05 of detection of a time offset. The step E05 is implemented after the step E04, so that the frequency difference obtained in the step E04 can be applied for all the subsequent individual Fourier transform processing operations, notably during the step E05 and during the reading LEC.

The header may comprise, after a succession of symbols S0, a string of at least one pair of consecutive symbols S1 and S0. A number of time-offset samplings E051 can then be implemented. For example, a number M of time-offset samplings E051. These samplings can be implemented as soon as the step E045 described with reference to FIG. 3 has been implemented.

The start of a sampling can be offset in time relative to a previous sampling by a duration of the order of the ratio between the duration of a symbol and the number of samplings E051 implemented.

The samples obtained during each step E051 can be used to implement individual discrete Fourier transform processing operations (step E052), these individual processing operations all being associated with the frequency f1 associated with the symbol S1, by taking into account the frequency difference obtained previously.

The maximum result of the individual discrete Fourier transform processing operations corresponds to the correct time position of the symbols (step E053), and all the subsequent symbols can be read by taking this difference into consideration.

The maximum result can be compared to a threshold in order to determine whether a symbol S1 has truly been determined. If such is not the case, the sampling steps E051 can be re-implemented.

As can be imagined, a high number of time-offset samplings makes it possible to obtain a better accuracy for the determination of the time offset.

Also, for a header comprising a number of strings S0-S1, a number of successive time-offset samplings, and a number of successive individual Fourier transform processing operations, can be implemented in order to be able to add up the results of the individual processing operations for all the processing operations corresponding to one and the same time offset. The time offset is thus determined more accurately.

Figure 5:
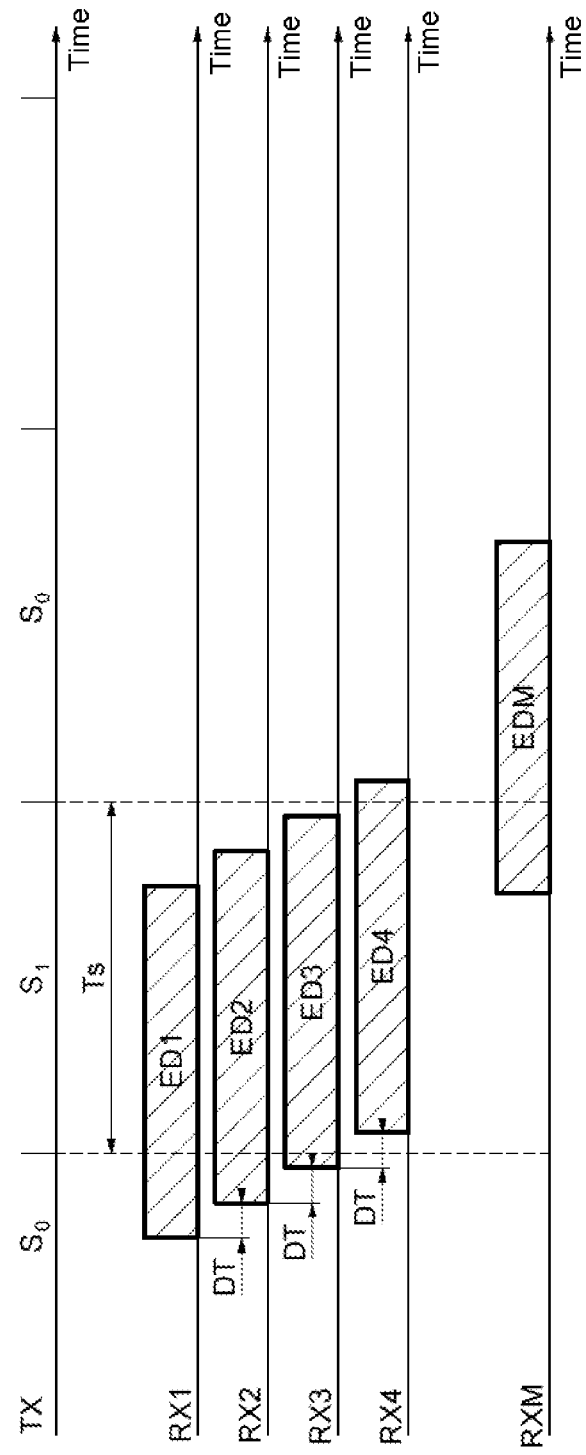

FIG. 5 schematically represents the time position of the different windows during which samplings E0S1 are implemented. In this figure, the axis TX corresponds to the signal transmitted, the header of which comprises a string of pairs S0-S1.

FIG. 5 also represents a plurality of axes RX1, RX2, RX3, RX4 up to RXM, illustrating the implementation of M time-offset samplings ED1 to EDM during steps E0S1, each sampling being implemented with a time offset DT.

As can be seen in the figure, the sampling ED3 corresponds to the best time position to detect a symbol S1. This means that the time difference to be determined is, in this example, approximately two times DT.

Figure 6:
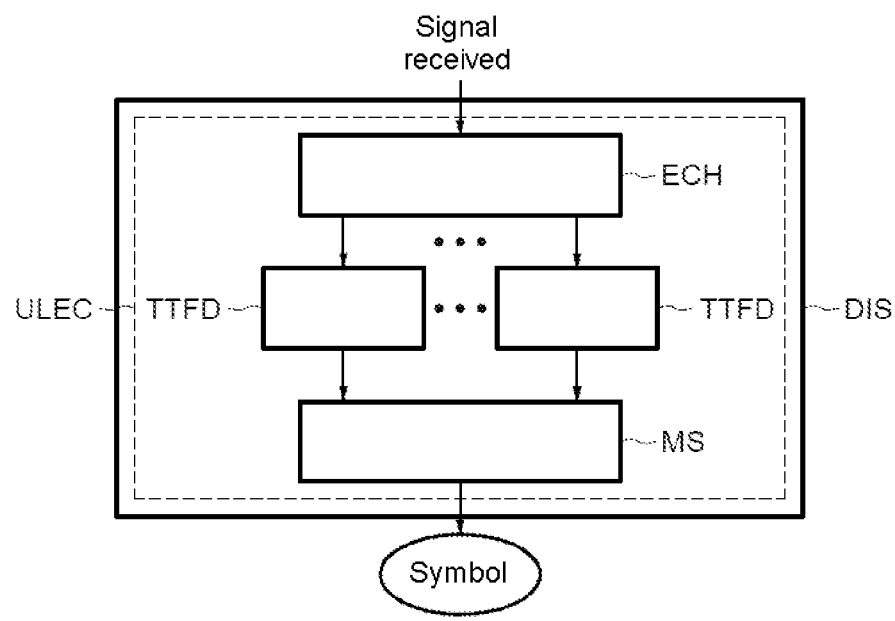
FIG. 6 schematically represents a device according to one embodiment of the invention, and FIG. 7 schematically illustrates an individual processing module according to one embodiment of the invention.

FIG. 6 represents a processing device DIS suitable for processing a frequency-modulated analog signal, for example the frequency-modulated signal that can be processed according to the method described with reference to FIGS. 1 to 5.

The device DIS comprises a symbol reading unit ULEC comprising a sampler ECH suitable for delivering samples, for example N samples, from a signal portion corresponding to the duration of a symbol.

The device DIS also comprises M individual discrete Fourier transform processing modules TTFD, with which can be associated frequencies, notably frequencies from a set of M frequencies. The modules TTFD have the samples supplied by the sampler ECH for input and respectively deliver a result at the output.

The device DIS also comprises a module MS configured to determine the value of the symbol that has the M results from the modules TTFD for input.

The device DIS may comprise other modules that can use the N modules TTFD, notably modules configured to implement the steps E04 and E05.

Figure 7:
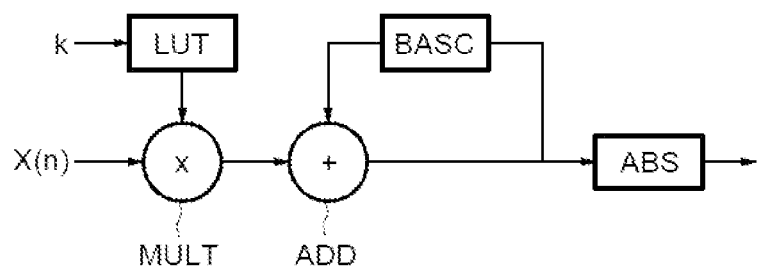

FIG. 7 represents in more detail a module TTFD. The module TTFD comprises a mapping table LUT, a multiplier MULT, an adder ADD, a flip-flop BASC and a circuit ABS configured to determine the modulus of a complex.

The module TTFD is suitable for implementing the following calculation:

$$DFT(k) = \left| \sum_{n=0}^{N-1} x(n) \cdot e^{-i2k\pi/N} \right|$$

The value of k, associated with the frequency of a symbol, is supplied at the input of the module, more specifically at the input of the mapping table LUT, the output of which supplies the complex number $e^{-i2k\pi/N}$.

The output of the mapping table LUT is multiplied by the value of one of the samples received x(n) by the multiplier MULT. The output of the multiplier is supplied to the adder ADD, the output of which is looped to the input by means of the flip-flop BASC, for example a Flip-Flop D to be able to add the result of a multiplication $x(n) \cdot e^{-i2k\pi/M}$ with the preceding results (for the indices ranging from 0 to n−1).

Finally, in the module TTFD, the circuit ABS is configured to determine the modulus of the complex obtained at the output of the adder ADD.

It can be noted that, according to one aspect, the invention makes it possible to read signals that have a signal-to-noise ratio ranging from 0 up to −20 dB, by using frequencies of the order of 2.4 GHz, and symbol durations of the order of 1 millisecond.

According to another aspect, the invention makes it possible to obtain a simple symbol reading, which uses a number of individual discrete Fourier transform processing modules equal to the number of symbols to be read, and for which the complexity is low.

What is claimed is:

1. A method for processing a frequency-modulated analog signal, the signal comprising a number of symbols belonging to a set of M symbols, each symbol being associated with at least one frequency of a set of M frequencies, the method comprising:
    converting the frequency-modulated analog signal to a discrete signal by using a sampler to sample a signal portion corresponding to a duration of a symbol;
    delivering, by the sampler, N samples, M being less than N;
    performing M individual discrete Fourier transform processing operations on the N samples, each individual processing operation being associated with each of the frequencies, the M individual processing operations delivering M processing results; and
    determining a value of the symbol from the M processing results.

2. The method according to claim 1, wherein the method comprises performing an initial phase of processing a header comprising a succession of known symbols, the initial phase comprising determining a frequency difference of the M frequencies relative to their nominal value and determining a time offset of one of the known symbols of the header relative to a sampling start instant associated with this symbol.

3. The method according to claim 2, wherein determining the frequency difference comprises:
    selecting a group of P frequencies situated in the vicinity of the frequency associated with a first known symbol;
    sampling, by the sampler, a signal portion corresponding to the duration of a number of symbols;
    performing P individual discrete Fourier transform processing operations respectively associated with the P frequencies of the groups, the P individual processing operations delivering P results; and
    determining the frequency difference from a maximum of the P results.

4. The method according to claim 3, wherein the P individual processing operations are performed in blocks of at most M simultaneous individual processing operations.

5. The method according to claim 3, wherein determining the frequency difference further comprises:
    comparing a maximum result with a first threshold;
    determining a second result corresponding to a second maximum;
    calculating a ratio between the maximum result and the second result; and
    comparing the ratio with a second threshold.

6. The method according to claim 3, wherein determining the time offset of one of the known symbols of the header comprises detecting a second known symbol different from the first known symbol.

7. The method according to claim 6, wherein determining the time offset comprises:
    performing, by the sampler, at least R time-offset samplings of a signal portion having a duration corresponding to a symbol so as to obtain R sets of N samples;
    performing R individual discrete Fourier transform processing operations on respectively the R sets of N samples, all these individual processing operations being associated with the frequency corresponding to the second symbol, so as to obtain M results; and determining the time offset value from the maximum of the R results.

8. The method according to claim 7, wherein R equals M.

9. The method according to claim 7, wherein determining the time offset comprises performing Q consecutive detections of the second known symbol, the Q detections delivering Q times R results, R additions of Q homologous results and a determination of the time offset from the R results of the additions.

10. The method according to claim 1, wherein the M symbols are respectively associated with at least two frequencies of the set of M frequencies, and
wherein the analog signal is received by the sampler from an antenna configured for the at least two frequencies.

11. A device for processing a frequency-modulated analog signal, the signal comprising a number of symbols belonging to a set of M symbols, each symbol being associated with at least one frequency of a set of M frequencies, the device comprising:
a sampler configured to convert the frequency-modulated analog signal from an analog signal to a discrete signal by determining N samples from a signal portion corresponding to a duration of a symbol, where M is less than N; and
M individual discrete Fourier transform modules having the N samples for input and outputting an individual processing result, each individual Fourier transform module being associated with each of the frequencies.

12. The device according to claim 11, further comprising:
comparison circuitry configured to determine a symbol value of the symbol having M results of the Fourier transform modules for input; and
a reception circuit comprising an oscillator, the reception circuit configured to:
process a header comprising a succession of known symbols;
determine a frequency difference of the M frequencies relative to their nominal value; and
determine a time offset of one of the known symbols of the header relative to a sampling start instant associated with this symbol.

13. The device according to claim 12, wherein the reception circuit further comprises an oscillator, the sampler, and the comparison circuitry, and wherein the reception circuit is further configured to:
select a group of P frequencies situated in vicinity of the frequency associated with a first known symbol;
sample a signal portion corresponding to the duration of a number of symbols and whose output communicates with the M individual Fourier transform modules to deliver P results, the individual Fourier transform modules being associated with frequencies of the group of P frequencies; and
determine the frequency difference from the maximum of the P results.

14. The device according to claim 13, wherein the reception circuit is further configured to:
compare the maximum result to a first threshold;
determine a second result corresponding to a second maximum;
calculate a ratio between the maximum result and the second result; and
compare the ratio with a second threshold.

15. The device according to claim 13, wherein the reception circuit is further configured to:
deliver R sets of N samples from R time-offset signal portions and whose output communicates with the M individual Fourier transform modules to deliver R results, each individual Fourier transform module being associated with the frequency of a second known symbol; and
determine the time offset value from the maximum of the R results.

16. The device according to claim 15, wherein R equals M.

17. The device according to claim 15, wherein the reception circuit is further configured to:
deliver R sets of N samples by delivering Q times R sets of samples to obtain Q times R results;
add Q homologous results to obtain R results; and
determine the time offset from the R results of the additions.

18. The device according to claim 12, wherein the reception circuit is further configured to:
select a group of P frequencies situated in vicinity of the frequency associated with a first known symbol;
sample a signal portion corresponding to the duration of a number of symbols and whose output communicates with the M individual Fourier transform modules to deliver P results, the individual Fourier transform modules being associated with frequencies of the group of P frequencies; and
determine the frequency difference from the maximum of the P results.

19. The device according to claim 18, wherein the reception circuit is further configured to:
compare the maximum result to a first threshold;
determine a second result corresponding to a second maximum;
calculate a ratio between the maximum result and the second result; and
compare the ratio with a second threshold.

20. The device according to claim 18, wherein the reception circuit is further configured to:
deliver R sets of N samples from R time-offset signal portions and whose output communicates with the M individual Fourier transform modules to deliver R results, each individual Fourier transform module being associated with the frequency of a second known symbol; and
determine the time offset value from the maximum of the R results.

21. The device according to claim 20, wherein R equals M.

22. The device according to claim 20, wherein the reception circuit is further configured to deliver Q times R sets of samples to obtain Q times R results and to add Q homologous results and determine the time offset from the R results of the additions.

23. The device according to claim 11, wherein the M symbols are respectively associated with at least two frequencies of the set of M frequencies.

24. A device for processing a frequency-modulated analog signal, the signal comprising a number of symbols belonging to a set of M symbols, each symbol being associated with at least one frequency of a set of M frequencies, the device comprising:
means for sampling a signal portion corresponding to a duration of a symbol;
means for delivering N samples, M being less than N;
means for performing M individual discrete Fourier transform processing operations on the N samples, each individual processing operation being associated with each of the frequencies, the M individual processing operations delivering M processing results; and
means for determining a value of the symbol from the M processing results.

25. The device according to claim 24, further comprising means for performing an initial phase of processing a header comprising a succession of known symbols, the initial phase comprising a determination of a frequency difference of the M frequencies relative to their nominal value and a determination of a time offset of one of the known symbols of the header relative to the sampling start instant associated with this symbol.

26. A device for processing a frequency-modulated analog signal, the signal comprising a number of symbols belonging to a set of M symbols, each symbol being associated with at least one frequency of a set of M frequencies, the device comprising:
- a sampler configured to:
  - convert the signal from an analog signal to a discrete signal by sampling a signal portion corresponding to a duration of a symbol; and
  - deliver N samples, M being less than N; and
- a discrete Fourier transform module comprising:
  - a mapping table;
  - a multiplier;
  - an adder;
  - a flip-flop; and
  - a complex modulus circuit,
  wherein the discrete Fourier transform module is configured to perform M individual discrete Fourier transform processing operations on the N samples, each individual processing operation being associated with each of the frequencies, the M individual processing operations delivering M processing results.

27. The device according to claim 26, further comprising comparison circuitry configured to determine a value of the symbol from the M processing results, wherein the device includes an initial phase processing circuit that includes the sampler, the discrete Fourier transform module, and the comparison circuitry, wherein the initial phase processing circuit is configured to perform an initial phase of processing a header comprising a succession of known symbols, the initial phase comprising a determination of a frequency difference of the M frequencies relative to their nominal value and a determination of a time offset of one of the known symbols of the header relative to a sampling start instant associated with this symbol.

* * * * *